(12) United States Patent
Cho et al.

(10) Patent No.: US 8,237,330 B2
(45) Date of Patent: Aug. 7, 2012

(54) VIBRATING ELEMENT, FABRICATION METHOD THEREOF, AND ULTRASONIC MOTOR HAVING THE SAME

(75) Inventors: Jin-woo Cho, Seongnam-si (KR); Ji-hyuk Lim, Suwon-si (KR); Sung-hyuk Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 714 days.

(21) Appl. No.: 12/368,705

(22) Filed: Feb. 10, 2009

(65) Prior Publication Data

US 2010/0072861 A1 Mar. 25, 2010

(30) Foreign Application Priority Data

Sep. 25, 2008 (KR) .................. 10-2008-0094234

(51) Int. Cl.
*H01L 41/08* (2006.01)
*H02N 2/10* (2006.01)

(52) U.S. Cl. ......... 310/323.01; 310/323.06; 310/323.04; 310/323.09; 310/316.02; 310/366

(58) Field of Classification Search ............ 310/323.06, 310/323.04, 323.03, 323.09, 323.13, 323.15, 310/323.11, 316.02, 365, 366, 369, 328; *H02N 2/10*
See application file for complete search history.

(56) References Cited

U.S. PATENT DOCUMENTS

| 4,562,373 A * | 12/1985 | Tokusima et al. ............. 310/328 |
| 5,892,317 A * | 4/1999 | Mukohjima et al. ...... 310/323.03 |
| 6,747,397 B2 * | 6/2004 | Maruyama .................... 310/328 |

* cited by examiner

*Primary Examiner* — Thomas Dougherty
*Assistant Examiner* — Karen B Addison
(74) *Attorney, Agent, or Firm* — Sughrue Mion, PLLC

(57) ABSTRACT

A vibrating element of an ultrasonic motor includes a vibrating member, and a piezoelectric body to produce a traveling wave thus to vibrate the vibrating member when electric power is applied to the piezoelectric body. The piezoelectric body includes a first piezoelectric layer attached to the vibrating member and in which positive poles and negative poles are alternately polarized, a second piezoelectric layer attached to the first piezoelectric layer and in which positive poles and negative poles are alternately polarized, a plurality of electrodes formed on opposite surfaces of the first and second piezoelectric layers, and an electrode connecting part formed on outer circumferential surfaces of the first and second piezoelectric layers to selectively connect the plurality of electrodes to one other.

30 Claims, 15 Drawing Sheets

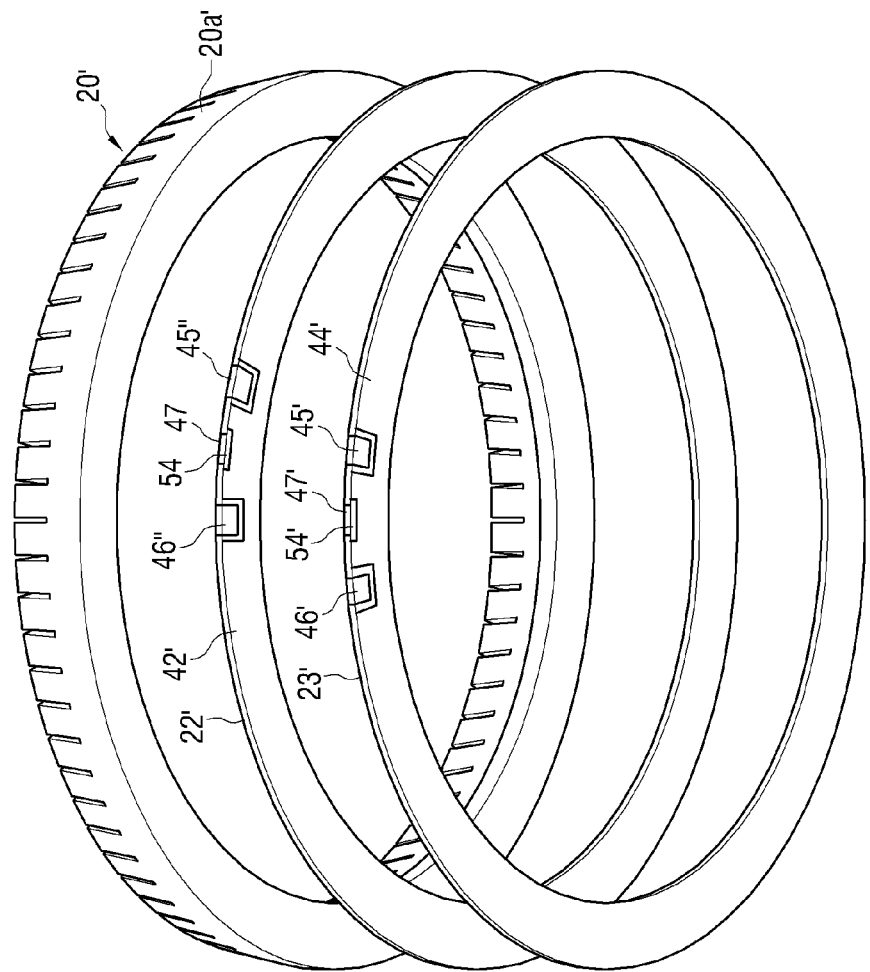

VIBRATING ELEMENT, FABRICATION METHOD THEREOF, AND ULTRASONIC MOTOR HAVING THE SAME

CROSS-REFERENCE TO RELATED PATENT APPLICATION

This application claims priority from Korean Patent Application No. 10-2008-0094234, filed on Sep. 25, 2008 in the Korean Intellectual Property Office, the entire disclosure of which is incorporated herein by reference.

BACKGROUND OF THE INVENTION

1. Field of the Invention

Apparatuses and methods consistent with the present invention relate to a vibrating element, a fabrication method thereof, and an ultrasonic motor having the same, and more particularly, to a vibrating element, which can be easily fabricated while having a simplified structure and an improved reliability, a fabrication method thereof, and an ultrasonic motor having the same.

2. Description of the Related Art

Generally, an ultrasonic motor, for example, a traveling wave type hollowed ultrasonic motor includes a vibrating element to generate a vibration, and a contacting element to rotate while coming in friction contact with the vibrating element according to the vibration of the vibrating element. To generate the vibration, the vibrating element is provided with a piezoelectric body, which generates deformations or displacements due to a piezoelectric effect when it is applied with a voltage having a high frequency of, for example, more than audio frequency. The contacting element rotates while coming in friction contact with the vibrating element according to the vibration of the vibrating element caused by the piezoelectric body.

In such an ultrasonic motor, a performance is dependent upon vibrating displacements of the vibrating element. Thus, to enlarge the vibrating displacements of the vibrating element, it is advantageous that the piezoelectric body generates the deformations as large as possible.

As an example of the piezoelectric body, there is generally known a single-layered piezoelectric body, which is made of one piezoelectric layer. The single-layered piezoelectric body is advantageous in that it can be easily fabricated and it is easy to form electrodes thereon for applying a voltage to the piezoelectric layer. However, because the piezoelectric layer is relatively thick, a relatively high voltage should be applied to the piezoelectric layer in order to produce a large electric field.

To address the problem as described above, a multi-layered piezoelectric body in which a plurality of piezoelectric layers are layered and electrodes are disposed between the piezoelectric layers has been proposed and used. The multi-layered piezoelectric body is configured so that each of the piezoelectric layers has a very thin thickness, for example, a thickness of several tens of microns. Thus, even though each of the piezoelectric layers is applied with a low voltage, an electric field produced on the multi-layered piezoelectric body increases in strength. However, because each of the electrodes disposed between the piezoelectric layers has a very thin thickness of, for example, several ten microns, connecting the electrodes with lead wires is very difficult and causes the motor to have a complicated construction. Also, even though the electrodes are connected with the lead wires, it is difficult to guarantee reliability in electrode connection.

To address the problem as described above, a method of forming holes in the respective piezoelectric layers and connecting the electrodes through the formed holes has been proposed. However, forming the holes in the respective piezoelectric layers requires a complicated fabrication process and increases the fabrication cost.

Accordingly, there is a need to develop an ultrasonic motor having an electrode connecting part capable of being easily fabricated while having a simplified structure and an improved reliability.

SUMMARY OF THE INVENTION

Exemplary embodiments of the present invention address at least the above aspects. Accordingly, an aspect of the present invention is to provide a vibrating element with an electrode connecting part capable of being easily fabricated while having a simplified structure and an improved reliability, a fabrication method thereof, and an ultrasonic motor having the same.

Additional aspects of the invention will be set forth in part in the description which follows and, in part, will be obvious from the description, or may be learned by practice of the invention.

According to one aspect of an exemplary embodiment of the present invention, there is provided a vibrating element of an ultrasonic motor, the vibrating element including a vibrating member, and a piezoelectric body which is attached to the vibrating member and produces a traveling wave thus to vibrate the vibrating member when the piezoelectric body is supplied with an electric power. The piezoelectric body includes a first piezoelectric layer having a first surface, a second surface opposite to the first surface, and an outer circumferential surface, the first piezoelectric layer being attached to the vibrating member, a second piezoelectric layer having a first surface, a second surface opposite to the first surface, and an outer circumferential surface, the second piezoelectric layer being attached to the first piezoelectric layer, an electrode part comprising a plurality of electrodes formed on first surfaces and the second surfaces of the first and second piezoelectric layers, and an electrode connecting part formed on outer circumferential surfaces of the first and second piezoelectric layers to selectively connect the plurality of electrodes to one other.

Here, the vibrating member may be formed of a material having an electric conductivity.

The first and second piezoelectric layers may be attached to each other by one of a conductive adhesive and a non-conductive adhesive. At this time, the conductive adhesive may include a conductive epoxy resin and the non-conductive adhesive may include a non-conductive epoxy resin.

Each of the first and second piezoelectric layers include positive poles and negative poles alternately arranged. The polarized positive and negative poles have a spatial phase difference of $\lambda/4$, wherein $\lambda$ is a length of one wavelength in a circumferential direction of the traveling wave.

The electrode part may include a first electrode formed on the first surface of the first piezoelectric layer, a second electrode formed on the second surface of the first piezoelectric layer, a third electrode formed on the first surface of the second piezoelectric layer, a fourth electrode formed on the second surface of the second piezoelectric layer, a fifth electrode formed separately from the fourth electrode on the second surface of the second piezoelectric layer, and a sixth electrode formed separately from the fourth and fifth electrodes on the second surface of the second piezoelectric layer.

At this time, each of the fifth and sixth electrodes may be selectively connected with at least one of the first electrode, the second electrode, the third electrode and the vibrating member by the electrode connecting part.

The electrode connecting part may include a first conductor which electrically connects the fifth electrode and the first electrode to each other, and a second conductor which electrically connects the sixth electrode and the third electrode to each other.

In this case, the first conductor may be extended from the fifth electrode along the outer circumferential surface of the second piezoelectric layer to the outer circumferential surface of the first piezoelectric layer and connected with a contact of the first electrode extended onto the outer circumferential surface of the first piezoelectric layer. Here, the first conductor may be further extended to the vibrating member. The second conductor may be extended from the sixth electrode to the outer circumferential surface of the second piezoelectric layer and is connected with a contact of the third electrode extended onto the outer circumferential surface of the second piezoelectric layer. Here, the second conductor may be further extended to a contact of the second electrode extended to an outer edge of the second surface of the first piezoelectric layer.

In addition, alternatively, a pattern of the electrodes formed on the first piezoelectric layer is the same as a pattern of the electrodes formed on the second piezoelectric layer and is disposed to have a spatial phase difference of $\lambda/4$ to the pattern of the electrodes formed on the second piezoelectric layer, wherein $\lambda$ is a length of one wavelength in a circumferential direction of the traveling wave.

The electrode connecting part may include a first conductor to electrically connect the fifth electrode and the vibrating member to each other. The first piezoelectric layer may have an electrode pattern in which a first dummy electrode, a subsidiary connecting part, and a second dummy electrode are disposed in an interval of $\lambda/4$ in a circumferential direction relative to one another, the first dummy electrode being extended from the second surface to the first surface via the outer circumferential surface and separated from the first and second electrodes, the subsidiary connecting part being formed on the outer circumferential surface and separated from the first and second electrodes, and the second dummy electrode being extended from the second surface to the outer circumferential surface and separated from the first and second electrodes, and the second piezoelectric layer may have an electrode pattern in which the sixth electrode, a dummy subsidiary connecting part and the fifth electrode are formed to have the same pattern as the pattern of the first dummy electrode, the subsidiary connecting part, and the second dummy electrode of the first piezoelectric layer and disposed to have a phase difference of the interval of $\lambda/4$ relative to the first dummy electrode, the subsidiary connecting part, and the second dummy electrode of the first piezoelectric layer, wherein $\lambda$ is a length of one wavelength in a circumferential direction of the traveling wave. A portion of the fifth electrode may extend onto the outer circumference of the second piezoelectric layer and the first conductor may extend from the portion of the fifth electrode to an outer circumferential surface of the vibrating member, via the subsidiary connecting part formed on the outer circumference of the first piezoelectric layer.

Also, the electrode connecting part may further include a second conductor which electrically connects the sixth electrode and the second electrode to each other. The second conductor may be extended to an outer edge portion of the second electrode from a portion of the sixth electrode extended onto the outer circumferential surface of the second piezoelectric layer.

Apart from the question of structure, each of the first and second conductors may be formed of a conductive paste.

Also, one of an alternating voltage of sine form and an alternating voltage of cosine form may be applied to the fourth electrode, the other of the alternating voltage of sine form and the alternating voltage of cosine form may be applied to the fifth electrode, and the sixth electrode may be grounded.

According to another aspect of an exemplary embodiment of the present invention, there is provided an ultrasonic motor including a vibrating element as disclosed above and comprising a vibrating member, and a piezoelectric body which is attached to the vibrating member and produces a traveling wave when the piezoelectric body is supplied with an electric power; and a contacting element to come in friction contact with the vibrating element when the vibrating element is deformed by the traveling wave.

According to further another aspect of an exemplary embodiment of the present invention, there is provided a method for fabricating a vibrating element of an ultrasonic motor, including: preparing first and second piezoelectric layers, each having upper and lower surfaces on which at least one electrode is formed, respectively; attaching the first and second piezoelectric layers in order to a vibrating member; and forming an electrode connecting part on outer circumferential surface of the first and second piezoelectric layers to selectively connect the electrodes of the first and second piezoelectric layers.

Preparing the first and second piezoelectric layers may include forming first and second electrodes on the upper and lower surfaces of the first piezoelectric layer, respectively, forming third and fourth electrodes on the upper and lower surfaces of the second piezoelectric layer, respectively, forming a fifth electrode separately from the fourth electrode on the lower surface of the second piezoelectric layer, and forming a sixth electrode separately from the fourth and fifth electrodes on the lower surface of the second piezoelectric layer, and selectively connecting each of the fifth and the sixth electrodes with at least one of the first electrode, the second electrode, the third electrode and the vibrating member by the electrode connecting part.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above aspects of the present invention will be more apparent from the description of exemplary embodiments of the present invention taken with reference to the accompanying drawings, in which:

FIGS. 6A and 6B are exploded views exemplifying the vibrating element of FIG. 5 from which an electrode connecting part is omitted, when viewed from above and below, respectively.

Throughout the drawings, the same drawing reference numerals will be understood to refer to the same elements, features, and structures.

Figure 1:
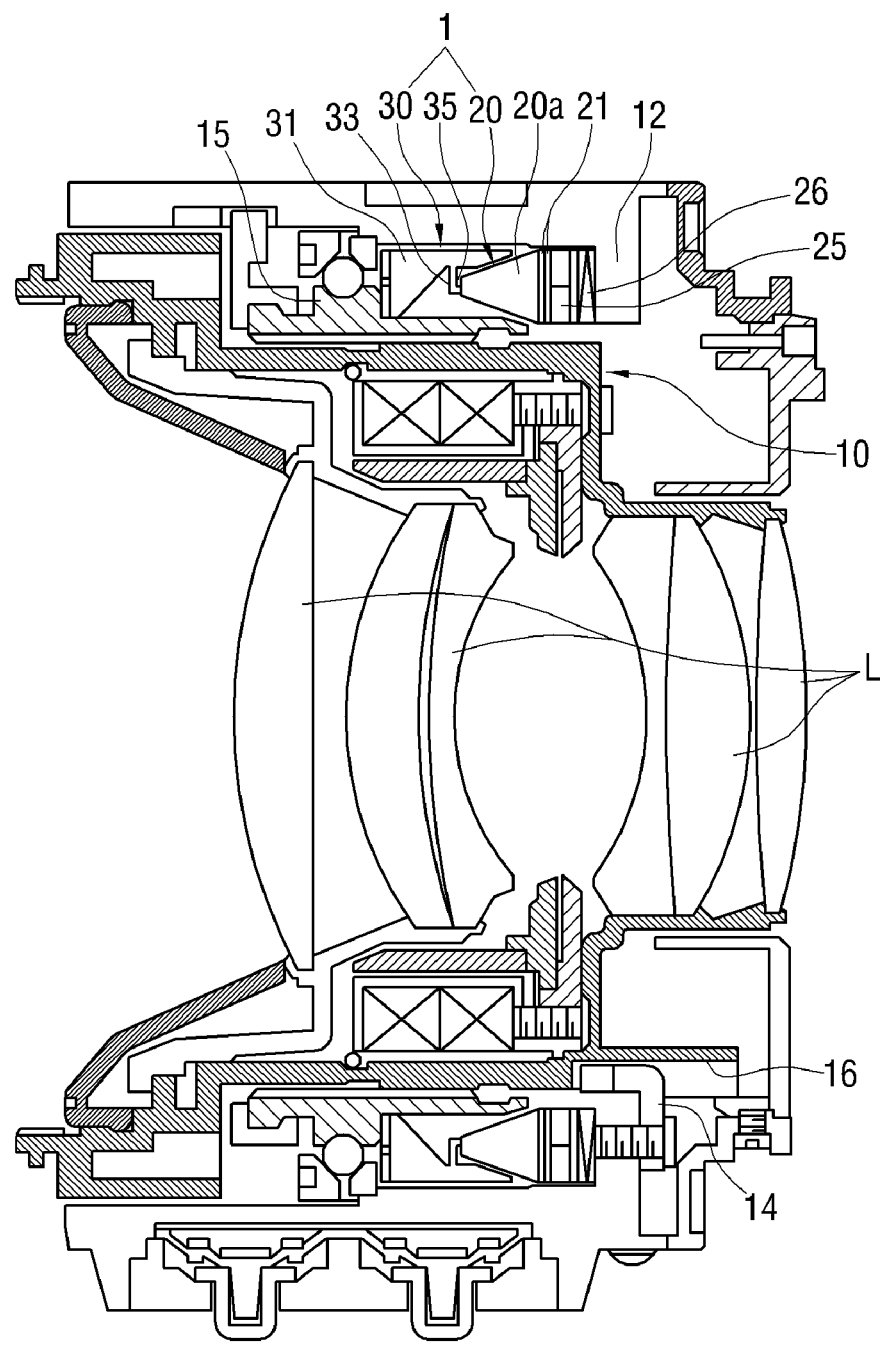
FIG. 1 is a cross-sectional view exemplifying a lens barrel to which an ultrasonic motor in accordance with an exemplary embodiment of the present invention is applied.

DETAILED DESCRIPTION OF ILLUSTRATIVE, NON-LIMITING EXEMPLARY EMBODIMENTS OF THE INVENTION

Reference will now be made in detail to exemplary embodiments of the present invention, which are illustrated in the accompanying drawings, wherein like reference numerals refer to the like elements throughout. The exemplary embodiments are described below in order to explain the present invention by referring to the figures.

FIG. 1 is a cross-sectional view exemplifying a lens barrel with an ultrasonic motor 1 to which a vibrating element 20 in accordance with an exemplary embodiment of the present invention is applied.

The ultrasonic motor 1 in accordance with the exemplary embodiment of the present invention, as a traveling wave type hollowed ultrasonic motor, is disposed between a movable cylinder 10 and a fixed cylinder 12 of the lens barrel and includes a contacting element 30 and a vibrating element 20. Since the movable cylinder 10 and the fixed cylinder 12 are generally known in the art, a detailed description thereof will be omitted.

The contacting element 30, as a rotor, provides a rotating force for rotating a rotary ring 15 spirally engaged to be rotatable around an outer circumferential surface of the movable cylinder 10. The contacting element 30 includes a rotating member 31 fixed on an outer right side of the rotary ring 15, according to the orientation shown in FIG. 1. A projection part 33 is protruded downward from a right end of the rotating member 31. The projection part 33 includes a friction material layer 35 coated on a right surface thereof to increase a friction force and to reduce a wear when the projection part 33 comes in press contact with the vibrating element 20. Here, the friction material layer 35 may be formed on an entire surface of the projection part 33 or the rotating member 31 of the contacting element 30, instead of being formed only on the right surface of the projection part 33.

The vibrating element 20 coming in press contact with the friction material layer 35 of the contacting element 30, as a stator, includes of a vibrating member 20a disposed inside the fixed cylinder 12. The vibrating member 20a is supported by a felt fixing member 25, and is urged toward the contacting element 30 by an elastic member 26 elastically supporting the felt fixing member 25, to come in press contact with the friction material layer 35 of the contacting element 30.

Figure 2:
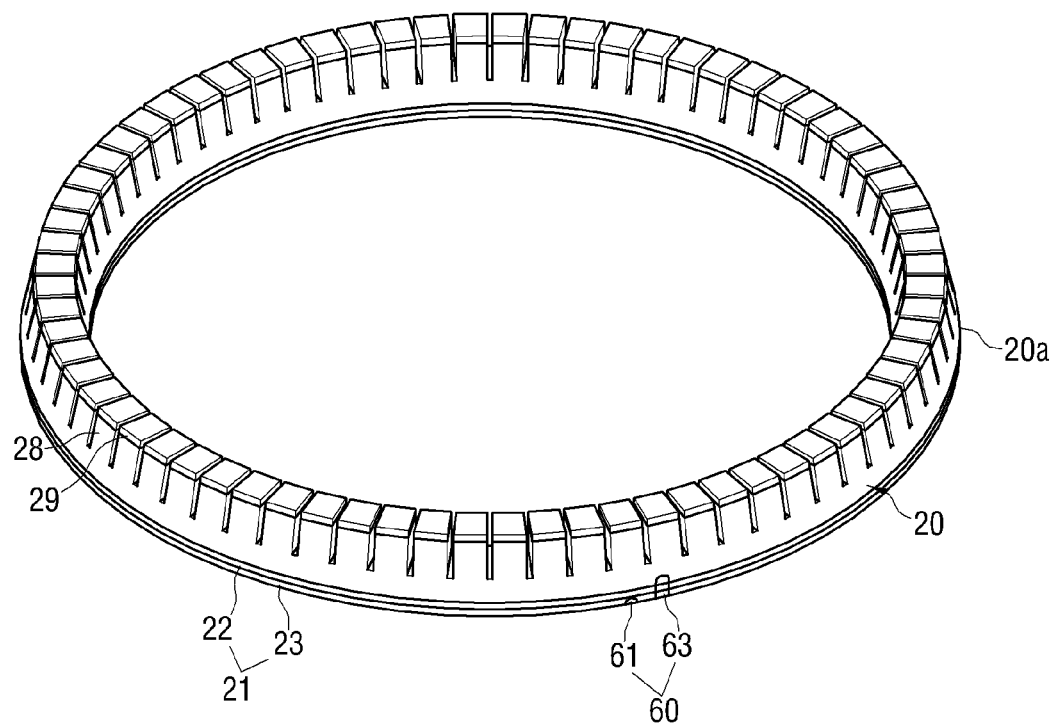
FIG. 2 is a perspective view exemplifying a vibrating element of the ultrasonic motor exemplified in FIG. 1.

As shown in FIG. 2, the vibrating member 20a is formed in the form of a hollowed disk or ring, and has a plurality of projections 28 formed on the side of a surface thereof coming in press contact with the friction material layer 35 of the contacting element 30. An abrasion resistance-coating layer 29 is coated on contacting surfaces of the plurality of projections 28 coming in friction contact with the friction material layer 35. Similar to the friction material layer 35, the abrasion resistance-coating layer 29 may be formed on an entire surface of the vibrating member 20a of the vibrating element 20, instead of being formed only on the contacting surfaces of the plurality of projections 28. The projections 28 function to increase an amplitude of elliptic motion, which is generated on the surface of the vibrating element 20 coming come in contact with the friction material layer 35 when the vibrating element 20 is vibrated by a traveling wave produced by a piezoelectric body 21 to be described later.

The vibrating member 20a may be formed of a material having an electric conductivity, for example, a bronze material or a steel material, such as a stainless steel.

The vibrating member 20a has a piezoelectric body 21 attached on an undersurface thereof to produce a traveling wave when an electric power is applied to the piezoelectric body 21. The vibrating member 20a is deformed or displaced by the traveling wave produced by the piezoelectric body 21, so that it is compressed to the contacting element 30 while vibrating.

The piezoelectric body 21 may be attached to the vibrating member 20a by a conductive adhesive 38 (see FIG. 3B), such as an epoxy resin containing a conductive material so that a first electrode 41 of a first piezoelectric layer 22 of the piezoelectric body 21 is electrically connected to the vibrating member 20a. Alternatively, the piezoelectric body 21 may be attached to the vibrating member 20a by a non-conductive adhesive (not shown), such as a non-conductive epoxy resin. In this case, since the non-conductive adhesive has a very thin thickness of, for example, about 10 microns, the vibrating member 20a and the first electrode 41 of the first piezoelectric layer 22 share partially contacted portions with each other and thus, are electrically connected with or to each other.

The piezoelectric body 21, as a piezoelectric body having a two-layer structure capable of obtaining a large electric field with a low voltage, is provided with a first piezoelectric layer 22 and a second piezoelectric layer 23, in each of which positive poles and negative poles are alternately polarized. Each of the first and second piezoelectric layers 22 and 23 is formed of a hollowed ceramic disk, or ring-shaped disk, having a thin thickness of, for example, several ten to several hundred microns, which can be minutely displaced or deformed due to a piezoelectric effect thus to generate a vibration, even though a low voltage is applied thereto.

Figure 3A:
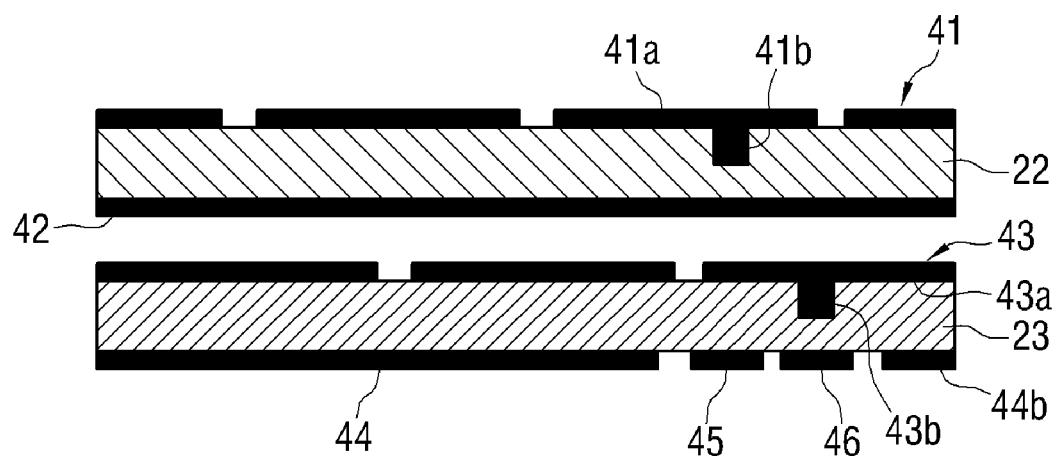
FIGS. 3A through 3D are partial side views exemplifying a fabrication method of the vibrating element of the ultrasonic motor exemplified in FIG. 2.
Figure 3B:
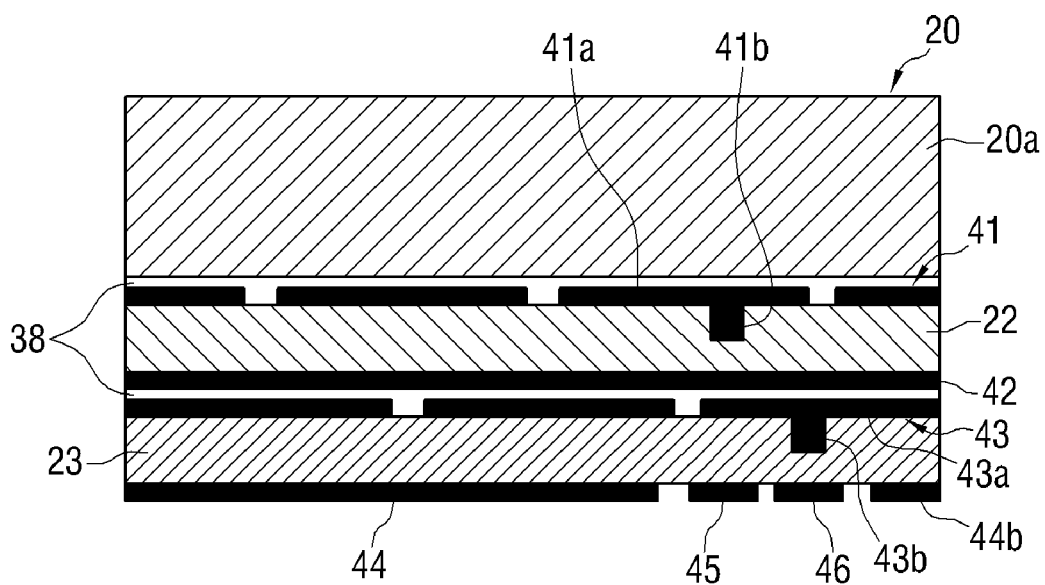
Figure 3C:
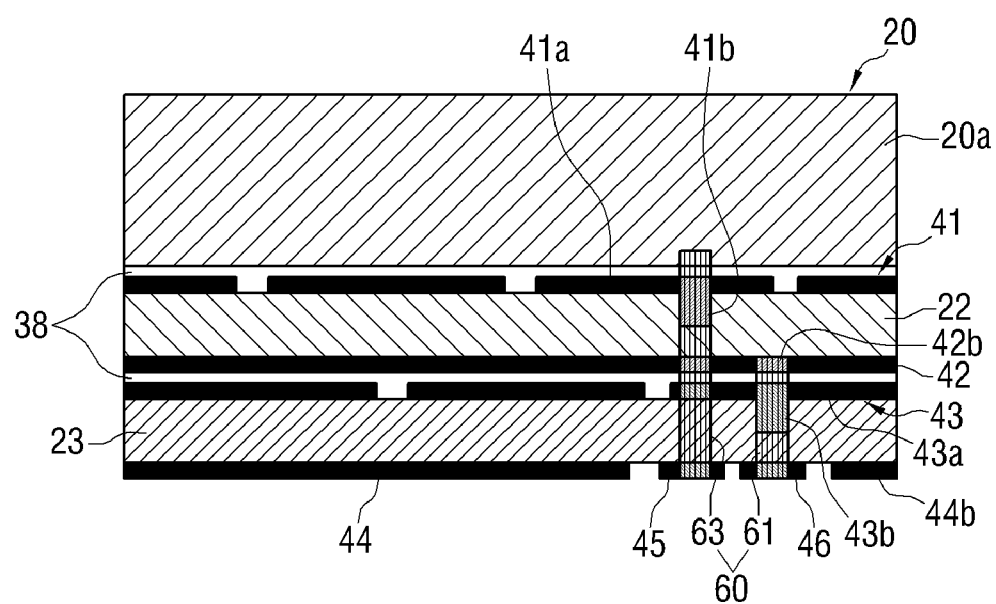
Figure 3D:
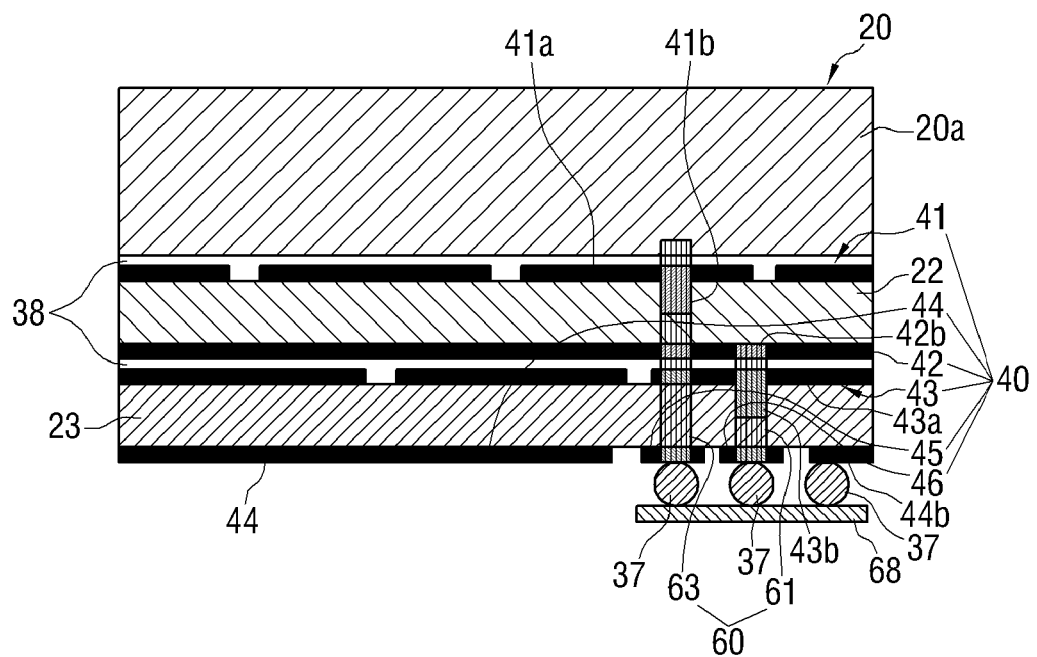

As shown in FIG. 3D, the first piezoelectric layer 22 has first and second electrodes 41 and 42 of an electrode part 40 formed on upper and lower surfaces thereof, respectively.

Figure 4A:
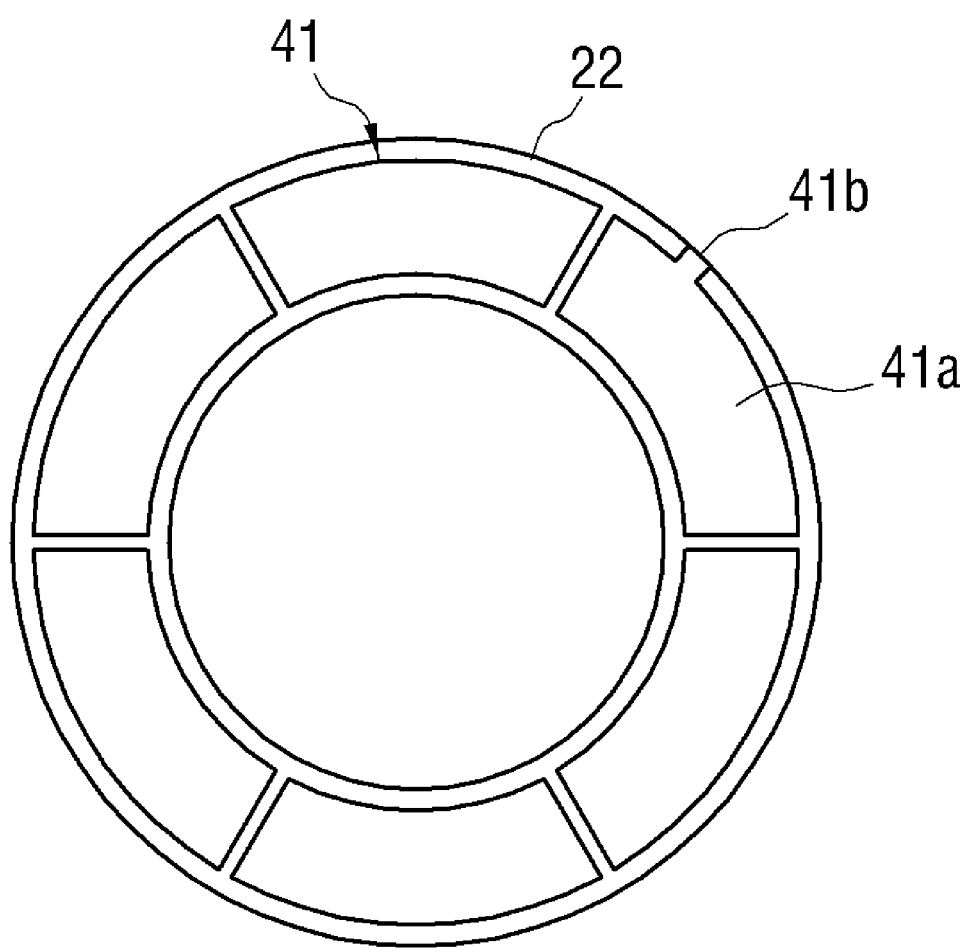
FIGS. 4A and 4C and FIGS. 4B and 4D are top plan views and bottom views exemplifying electrodes of the vibrating element of the ultrasonic motor exemplified in FIG. 2, respectively.

To alternately apply polarizing voltages of positive and negative poles to the first piezoelectric layer 22 in a polarizing process for the first piezoelectric layer 22, the first electrode 41 is made up of a plurality of electrode surfaces 41a (see FIG. 4A). The number of the electrode surfaces of the first electrode 41 may be 2N, wherein N is the number of wavelengths in a circumferential direction of the traveling wave, which is predetermined so that the piezoelectric element 21 produces the wave properly, i.e., produces an evenly traveling, stable wave. For instance, as shown in FIG. 4A, in the exemplary embodiment, the number of the electrode surfaces of the first electrode 41 is 6 because the number N of the wavelengths in the circumferential direction of the traveling wave, which is predetermined so that the piezoelectric element 21 properly produces the traveling wave, is 3.

As shown in FIGS. 3A through 3D and FIG. 4A, one of the plurality of electrode surfaces 41a has a contact 41b extended onto an outer circumferential surface of the first piezoelectric layer 22. The term "outer circumferential surface" is not limited to a surface having a circular outer periphery but refers to any outer peripheral surface. The contact 41b is connected with a first conductor 63 of an electrode connecting part 60, which will be described below. The first conductor 63 is connected with a fifth electrode 45 of the second piezoelectric layer 23. The fifth electrode 45 is connected a flexible printed circuit board 68 having a power controlling circuit (not shown) by a conductive bump 37, so that it can be applied with an alternating voltage of sine form.

Alternatively, the electrode surfaces of the first electrode 41 may be electrically connected with or to one another by connections (not shown). In this case, the connections are formed after the polarizing process for the first piezoelectric layer 22.

Figure 4B:
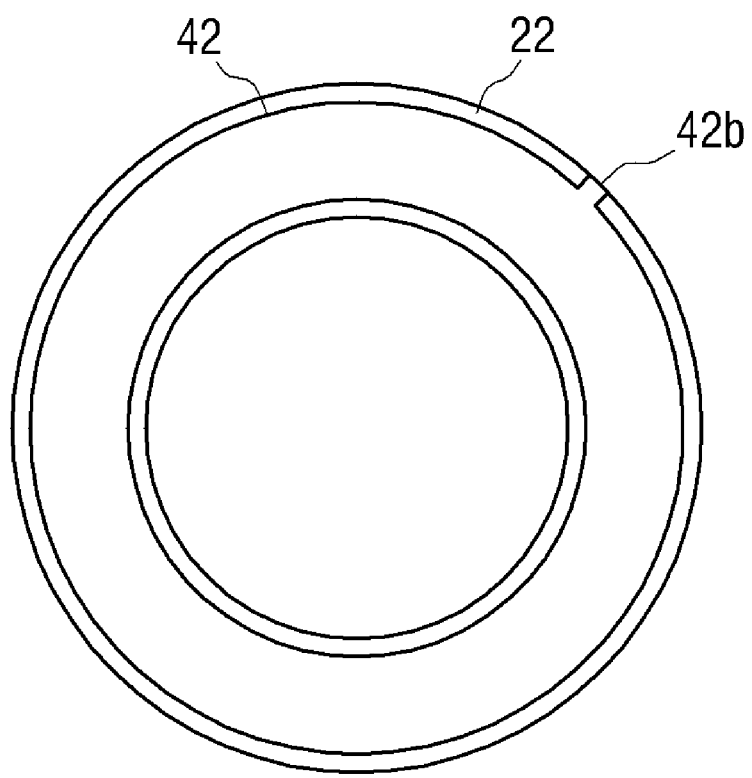

As shown in FIG. 4B, the second electrode 42 is made up of a single electrode surface. The reason why the second electrode 42 is made up of the single electrode surface is that since the second electrode 42 acts only as a ground electrode in the polarizing process for the piezoelectric layer 22, there is no need for the second electrode 42 to have a plurality of electrode surface like as the first electrode 41. The electrode surface of the second electrode 42 has a contact 42b extended to an outer edge of an undersurface of the first piezoelectric layer 22 at one side of the first piezoelectric layer 22, for example, a right side of an upper portion of FIG. 4B. As shown in FIGS. 3C and 3D, the contact 42b is connected with a second conductor 61 of the electrode connecting part 60 connected with a sixth electrode 46 to be described later. The sixth electrode 46 is connected to the flexible printed circuit board 68 by the conductive bump 37, so that it can be grounded.

The second piezoelectric layer 23 is attached to the first piezoelectric layer 22 by a conductive adhesive 38, such as an epoxy resin containing a conductive material. Thus, the second electrode 42 of the first piezoelectric layer 22 is electrically connected with a third electrode 43 of the second piezoelectric layer 23. Also, the contact 42b of the second electrode 42 and a contact 43b of the third electrode 43 are connected to the sixth electrode 46 through the second conductor 61 of the electrode connecting part 60, so that the second electrode 42 and the third electrode 43 are grounded.

Alternatively, the second piezoelectric layer 23 may be attached to the first piezoelectric layer 22 by a non-conductive adhesive (not shown), such as a non-conductive epoxy resin. In this case, since the non-conductive adhesive has a very thin thickness of, for example, about 10 microns, the second electrode 42 of the first piezoelectric layer 22 and the third electrode 43 of the second piezoelectric layer 23 share partially contacted portions with each other and thus, are electrically connected with or to each other.

When the second piezoelectric layer 23 is attached to the first piezoelectric layer 22, the second piezoelectric layer 23 and the first piezoelectric layer 22 are disposed so that arrangements of the polarized positive and the negative poles thereof have a spatial phase difference of $\lambda/4$, wherein $\lambda$ is a length of one wavelength in the circumferential direction. The reason why the second piezoelectric layer 23 and the first piezoelectric layer 22 are disposed to have the spatial phase difference of $\lambda/4$ is that to form one traveling wave from two sine waves generated from the first and second piezoelectric layers 22 and 23, respectively, when alternating voltages of sine and cosine forms, which coincide in frequency, are applied to the first and the fourth electrode 41 and 44, respectively, the two sine waves should have the spatial phase difference of $\lambda/4$.

The second piezoelectric layer 23 in which the positive and negative poles are alternately polarized has third and fourth electrodes 43 and 44 of the electrode part 40 formed on upper and lower surfaces thereof.

Figure 4C:
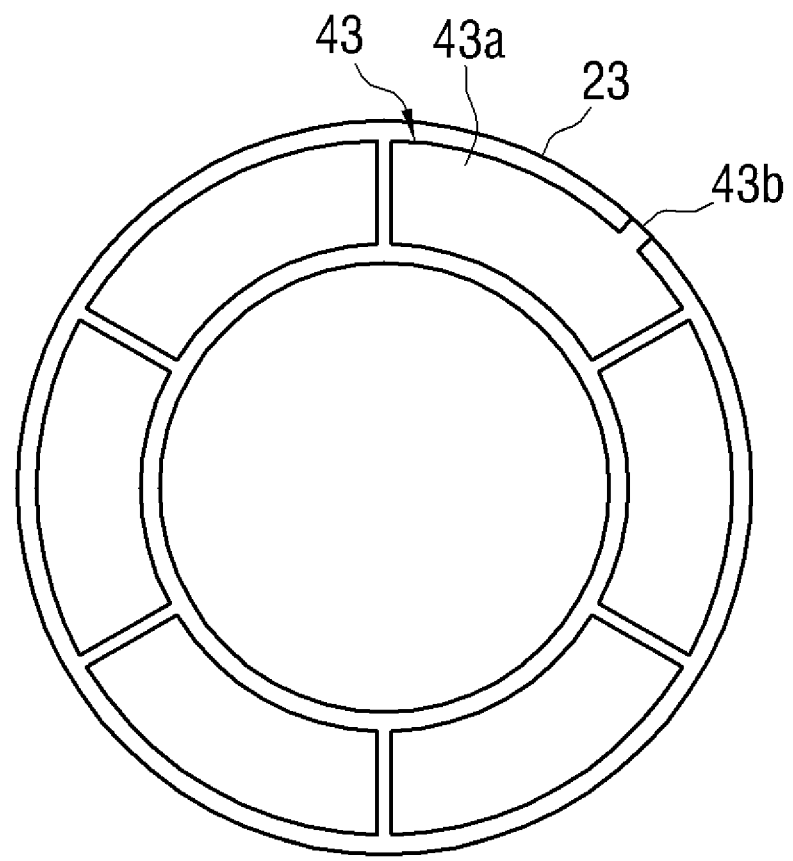

As shown in FIG. 4C, to alternately apply polarizing voltages of positive and negative poles to the second piezoelectric layer 23 in a polarizing process for the second piezoelectric layer 23, the third electrode 43 is made up of a plurality of, for example, six electrode surfaces.

As shown in FIGS. 3A through 3D, one of the plurality of electrode surfaces 43a has a contact 43b extended onto an outer circumferential surface of the second piezoelectric layer 23. The contact 43b is connected with the second conductor 61 of the electrode connecting part 60. The second conductor 61 is connected with the six electrode 46 grounded through the flexible printed circuit board 68.

Alternatively, the electrode surfaces 43a of the third electrode 43 may be electrically connected with or to one another by connections (not shown) like the electrode surfaces 41a of the first electrode 41. In this case, the connections are formed after the polarizing process for the second piezoelectric layer 23.

Figure 4D:
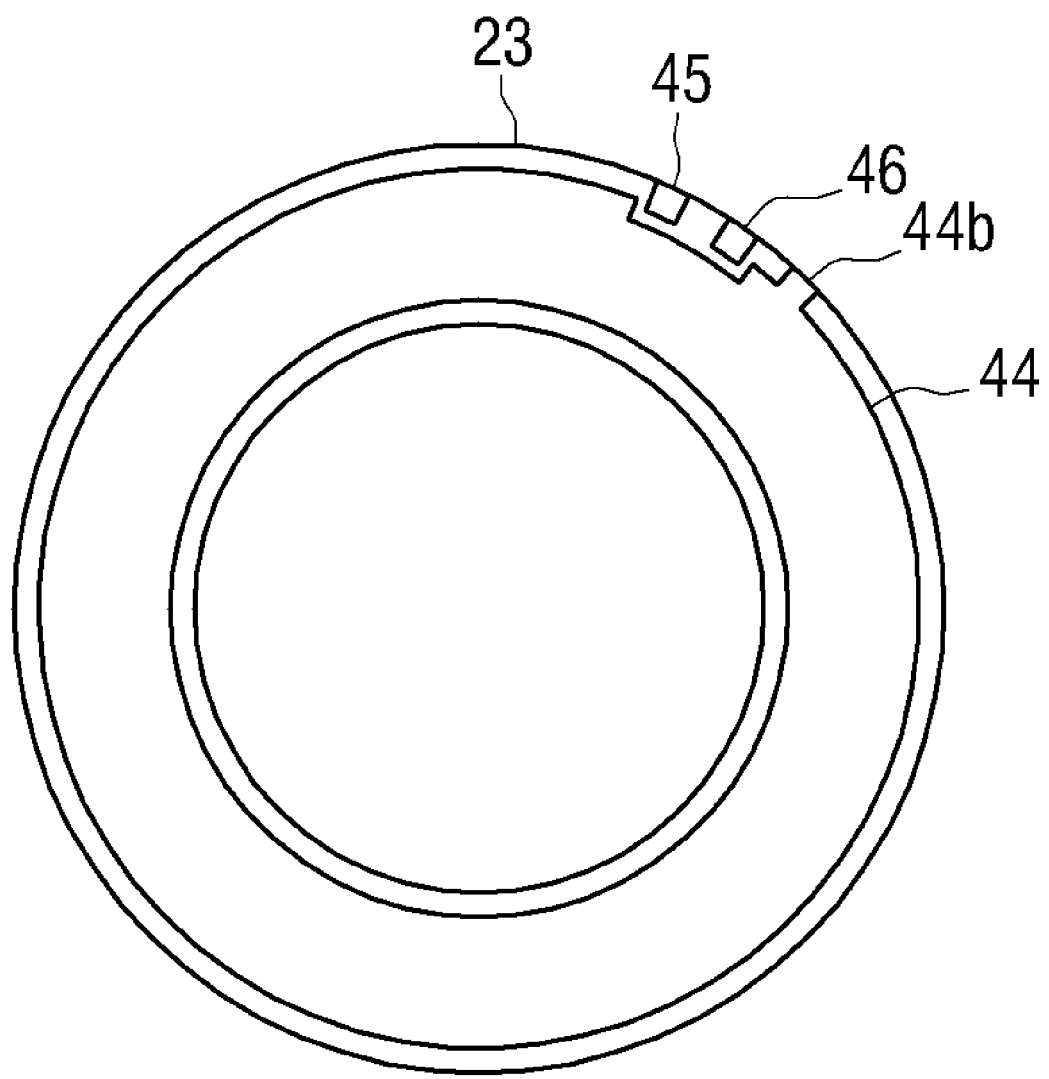

As shown in FIG. 4D, the fourth electrode 44 is made up of a single electrode surface like the second electrode 42. The electrode surface of the fourth electrode 44 has a contact 44b extended to an outer edge of an undersurface of the second piezoelectric layer 23 at one side of the second piezoelectric layer 23, for example, a right side of an upper portion of FIG. 4D. The contact 44b is connected with the flexible printed circuit board 68 having the power controlling circuit by a conductive bump 37, so that the fourth electrode 44 can be applied with the alternating voltage of cosine form.

On the undersurface of the second piezoelectric layer 23 in the vicinity of the contact 44b of the fourth electrode 44, the fifth and the sixth electrodes 45 and 46 of the electrode part 40 are formed separately from the fourth electrode 44. As described above, the fifth electrode 45 is connected to the flexible printed circuit board 68 by the conductive bump 37, so that it can be applied with the alternating voltage of sine form. The sixth electrode 46 is also connected to the flexible printed circuit board 68 by the conductive bump 37, so that it can be grounded.

To connect the fifth electrode 45 to the contact 41b of the first electrode 41 and/or the vibrating member 20a and to connect the sixth electrode 46 to the contact 43b of the third electrode 43 and/or the contact 42b of the second electrode 42, the electrode connecting part 60 is formed on the outer circumferential surfaces of the first and second piezoelectric layers 22 and 23.

The electrode connecting part 60 is made up of first and second conductors 63 and 61.

The first conductor 63 electrically connects the fifth electrode 45 and the first electrode 41 with or to each other. For this, the first conductor 63 is extended from the fifth electrode 45 along the outer circumferential surface of the second piezoelectric layer 23 to the outer circumferential surface of the first piezoelectric layer 22. At this time, the first conductor 63 is connected with the contact 41b of the first electrode 41 extended onto the outer circumferential surface of the first piezoelectric layer 22. Here, the first conductor 63 may be further extended to the vibrating member 20a because the first electrode 41 and the vibrating member 20a are already electrically connected with or to each other and there is no influence on an electric field produced from the first piezoelectric layer 22 even though the first electrode 41 and the vibrating member 20a are electrically connected with or to each other. In the exemplary embodiment shown in FIGS. 2 and 3D, the first conductor 63 is illustrated as being further extended to the vibrating member 20a.

Accordingly, the fifth electrode 45 is electrically connected to the contact 41b of the first electrode 41 and/or the vibrating member 20a through the first conductor 63.

The second conductor 61 electrically connects the sixth and the third electrodes 46 and 43 with or each other. For this, the second conductor 61 is extended from an outer edge of the sixth electrode 46 to the contact 43b of the third electrode 43 extended onto the outer circumferential surface of the second piezoelectric layer 23. Thus, because the third electrode 43 is already connected to the second electrode 42 by the conductive adhesives 38, the sixth electrode 46 is electrically connected to the second electrode 42 through the third electrode 43. However, to ensure a stability in electrical connection to the second electrode 42 and/or the third electrode 43, the second conductor 61 may be further extended to the contact 42b of the second electrode 42 extended onto the outer edge of the under surface of the first piezoelectric layer 22. In the exemplary embodiment shown in FIGS. 3C and 3D, the second conductor 61 is illustrated as being further extended to the contact 42b of the second electrode 42.

The first and second conductors 63 and 61 may be formed of a conductive paste, such as a silver paste, which can be easily formed on the first and second piezoelectric layers 22 and 23 and/or the vibrating member 20a.

A fabrication method of the vibrating element 20 constructed as described above will now be briefly described.

First, as shown in FIG. 3A, first and second piezoelectric layers 22 and 23 in the form of the hollowed ceramic disk are prepared. Here, the first and second piezoelectric layers 22 and 23 have first and second electrodes 41 and 42 and third and fourth electrodes 43 and 43 formed on upper and lower surfaces thereof, respectively.

Subsequently, each of the first and second piezoelectric layers 22 and 23 is polarized to have a polarized arrangement in which positive and negative poles are alternately disposed. Then electrode surfaces of the first and the third electrodes 41 and 43 are alternately applied with polarizing voltages of positive and negative poles, for example, +1000V and −1000V, and the second and the fourth electrode 42 and 44 are grounded.

Next, as shown in FIG. 3B, the first and second piezoelectric layers 22 and 23 are attached to a previously prepared vibrating member 20a by a conductive adhesive 38. At this time, the first and second piezoelectric layers 22 and 23 are attached with or to each other, so that the polarized arrangements thereof have a spatial phase difference of λ/4.

After the first and second piezoelectric layers 22 and 23 are attached to the vibrating member 20a, as shown in FIG. 3C, an electrode connecting part 60 is formed with a conductive paste on outer circumferential surfaces of the first and second piezoelectric layers 22 and 23. As a result, a fifth electrode 45 is connected to a contact 41b of the first electrode 41 and/or the vibrating member 20a by a first conductor 63, and a sixth electrode 46 is connected to a contact 43b of the third electrode 43 and/or a contact 42b of the second electrode 42 by a second conductor 61.

After the electrode connecting part 60 is formed on the outer circumferential surfaces of the first and second piezoelectric layers 22 and 23, as shown in FIG. 3D, the fourth, the fifth and the sixth electrodes 44, 45 and 46 are connected to a flexible printed circuit board 68 by a conductive bump 37 formed by a soldering, etc., and the fabrication of the vibrating element 20 is completed.

The vibrating element 20 fabricated as described above is configured, so that the electrode connecting part 60 is formed on the outer circumferential surfaces of the first and second piezoelectric layers 22 and 23 to selectively connect the electrodes 41, 42, 43, 44, 45 and 46. Thus, the vibrating element 20 is easier to fabricate, has a more simplified structure, and ensures a greater reliability in electrode connections, as compared with the related art ultrasonic motor in which the electrodes are connected through the wires or the holes formed in the first and second piezoelectric layers.

However, the vibrating element 20 as described above is configured, so that the first and second electrodes 41 and 42 of the first piezoelectric layer 22 have structures different from those of the third and the fourth electrodes 43 and 44 of the second piezoelectric layer 23. Thus, the first piezoelectric layer 22 and the second piezoelectric layer 23 are not exchangeable or compatible with each other, thereby causing the first piezoelectric layer 22 and the second piezoelectric layer 23 to require separate fabrication.

Figure 5:
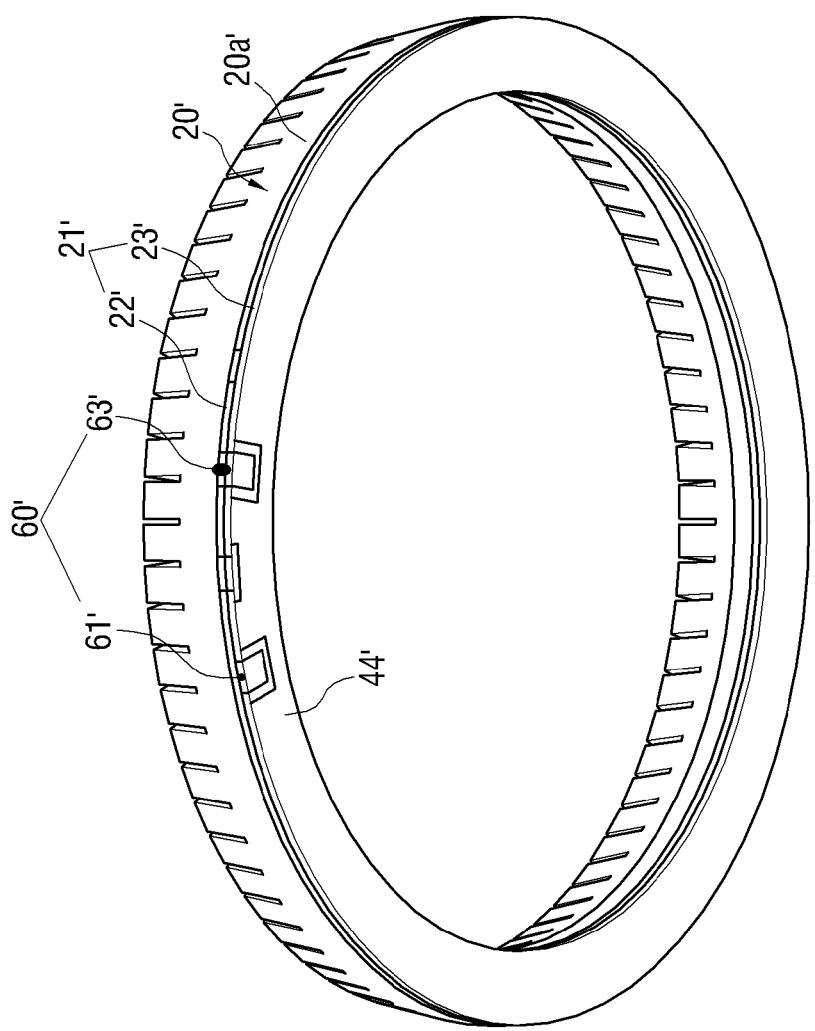
FIG. 5 is a perspective view exemplifying a modified exemplary embodiment of the vibrating element applied to the ultrasonic motor, when viewed from below.

FIGS. 5 through 6B shows a modified vibrating element 20' capable of using a first piezoelectric layer 22' and a second piezoelectric layer 23' that are exchangeable or compatible with each other and require a single fabrication process by identically forming electrode patterns of the first and second piezoelectric layers 22' and 23'.

The modified vibrating element 20' includes a vibrating member 20a', a first piezoelectric layer 22', a second piezoelectric layer 23', and an electrode connecting part 60'.

The vibrating member 20a' has the same construction as that of the vibrating member 20a as explained with reference to FIGS. 1 through 4D.

Each of the first and second piezoelectric layers 22' and 23' is formed of a hollowed ceramic disk, or ring, in which positive and negative poles are alternately polarized. The first and second piezoelectric layers 22' and 23' have the substantially same electrode pattern, but are disposed so that polarized arrangements thereof have a spatial phase difference of λ/4.

To be more specific, the first piezoelectric layers 22' in which the positive and the negative poles are alternately polarized has first and second electrodes 41' and 42' formed on upper and lower surfaces thereof.

Figure 6A:
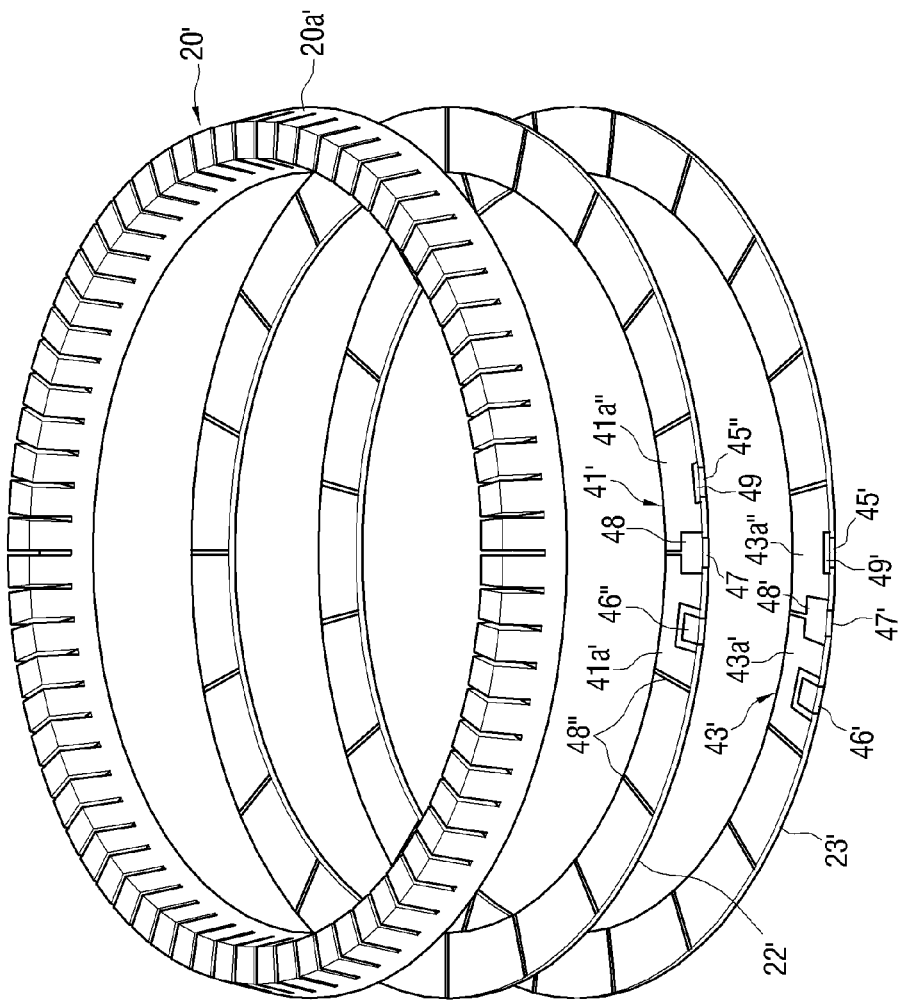
Figure 7A:
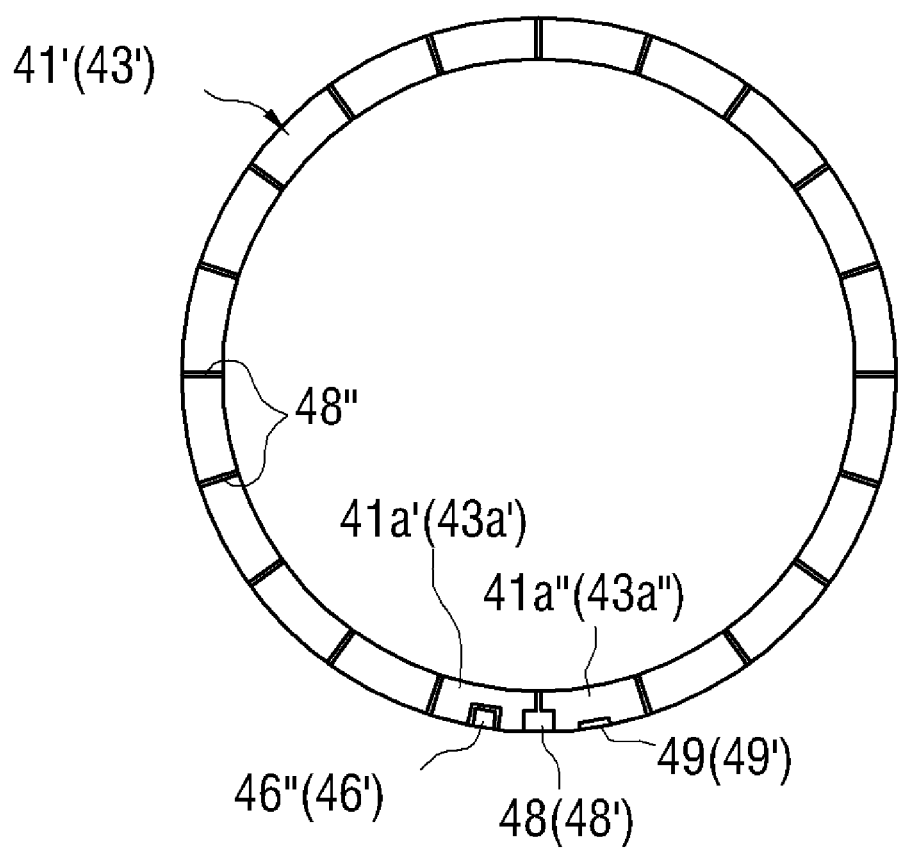
FIGS. 7A and 7B are a top plan view and a bottom plan view exemplifying electrodes of first and second piezoelectric layers of a piezoelectric body of the vibrating element exemplified in FIG. 5, in the same pattern for illustration.

As shown in FIGS. 6A and 7A, to alternately apply polarizing voltages of the positive and negative poles to the first piezoelectric layer 22' in a process for polarizing the first piezoelectric layer 22', the first electrode 41' is made up of a plurality of electrode surfaces. The number of the electrode surfaces of the first electrode 41' may be 2N, as in the first electrode 41 of the first piezoelectric layer 22 shown in FIG. 4A, wherein N is the number of wavelengths in the circumferential direction of the traveling wave, which is predetermined so that a piezoelectric body 21' properly produces a traveling wave. For instance, in the exemplary embodiment of FIGS. 6A and 7A, the number of the electrode surfaces of the first electrode 41' is 20 because the number N of the wavelengths in the circumferential direction of the traveling wave, which is predetermined so that the piezoelectric element 21' properly produces a traveling wave, is 10.

A first dummy electrode 46" is formed separately from one electrode surface 41a" among the plurality of electrode surfaces of the first electrode 41' in the range thereof. As shown in FIGS. 6A and 6B, the first dummy electrode 46" has a plate-shaped structure, and is formed on a lower surface of the first piezoelectric layer 22' and extended to an upper surface thereof. Because the first dummy electrode 46" is provided to make the electrode pattern of the first piezoelectric layer 22' be identical with the electrode pattern of the second piezoelectric layer 23', it is not connected with other electrodes. Thus, the first dummy electrode 46" does not have any role or function as an electrode.

Between the electrode surface 41a' and an electrode surface 41a" adjacent thereto is formed an enlarged electrode surface-boundary area 48 having more enlarged size than other electrode surface-boundary areas 48". The enlarged electrode surface-boundary area 48 is formed to surely separate the electrode surfaces 41a' and 41a" from a subsidiary connecting part 47 formed on an outer circumferential surface of the first piezoelectric layer 22'. The subsidiary connecting part 47 is connected with a first conductor 63' for connecting the vibrating member 20a' and a fifth electrode 45' to be descried later with or to each other.

In the electrode surface 41a" in the vicinity of the outer circumferential surface of the first piezoelectric layer 22' is formed a first electrode surface-separating area 49. The first electrode surface-separating area 49 is formed to separate a second dummy electrode 45" from the electrode surface 41a". The second dummy electrode 45" is formed on the lower surface of the first piezoelectric layer 22' and extended to the outer circumferential surface of the first piezoelectric layer 22'. Because the second dummy electrode 45" is also provided to make the electrode pattern of the first piezoelectric layer 22' be identical with the electrode pattern of the second piezoelectric layer 23', it is not connected with other electrodes, and thus does not have any role as an electrode.

The first dummy electrodes 46", the enlarged electrode surface-boundary area 48/the subsidiary connecting part 47, and the first electrode surface-separating area 49/the second dummy electrode 45", which are constructed as described above, are formed in intervals of $\lambda/4$.

Figure 7B:
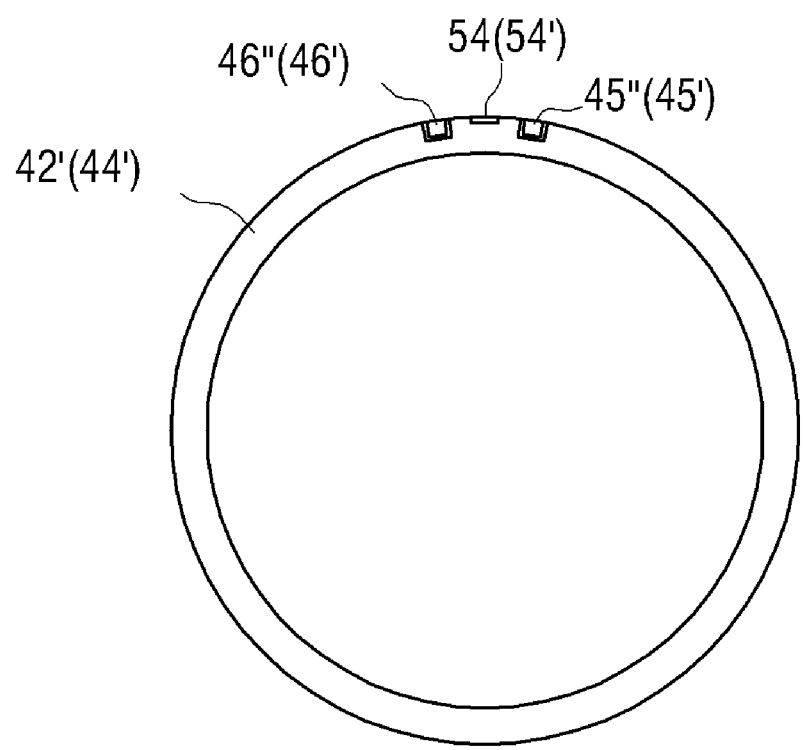

As shown in FIGS. 6B and 7B, the second electrode 42' is made up of a single electrode surface, like as the second electrode 42 of the first piezoelectric layer 22 shown in FIG. 4B. The electrode surface of the second electrode 42' is formed separately from the first and second dummy electrodes 46" and 45" formed on the lower surface of the first piezoelectric layer 22". To separate the subsidiary connecting part 47 from the electrode surface of the second electrode 42', a second electrode surface-separating area 54 is formed in the electrode surface of the second electrode 42' adjacent to the subsidiary connecting part 47.

Like the second piezoelectric layer 23 shown in FIG. 2, the second piezoelectric layer 23' is attached with the first piezoelectric layer 22' by a conductive adhesive, such as an epoxy resin containing a conductive material, or a non-conductive adhesive. At this time, the first and second piezoelectric layers 22' and 23' are disposed so that to form one traveling wave when alternating voltages are applied thereto, the arrangements of the polarized positive and the negative poles thereof have the spatial phase difference of $\lambda/4$.

The second piezoelectric layer 23' has a third electrode 43' and fourth, fifth and sixth electrodes 44', 45', and 46' formed on upper and lower surfaces thereof, respectively.

The second piezoelectric layer 23' has the substantially same electrode pattern as that of the first piezoelectric layer 22', but is disposed to have the spatial phase difference of $\lambda/4$ relative to the first piezoelectric layer 22'.

That is, as shown in FIGS. 6A and 7A, on the upper surface of the second piezoelectric layer 23' are formed the third electrode 43', the sixth electrode 46', a second enlarged electrode surface-boundary area 48', and a third electrode surface-separating area 49', which are formed in the same patterns as the patterns of the first electrode 41', the first dummy electrode 46", the first enlarged electrode surface-boundary area 48, and the first electrode surface-separating area 49 of the first piezoelectric layer 22', respectively. In addition, as shown in FIGS. 6B and 7B, on the lower surface of the second piezoelectric layer 23' are formed the fourth electrode 44', the sixth electrode 46', a fourth electrode surface-separating area 54' and the fifth electrode 45', which are formed in the same patterns as the patterns of the second electrode 42', the first dummy electrode 46", the second electrode surface-separating area 54, and the second dummy electrode 45" of the first piezoelectric layer 22', respectively. Also, on an outer circumferential surface of the second piezoelectric layer 23' is formed a dummy subsidiary connecting part 47' corresponding to the subsidiary connecting part 47 of the first piezoelectric layer 22'. Because the dummy subsidiary connecting part 47' is provided to make the electrode pattern of the first piezoelectric layer 22' be identical with the electrode pattern of the second piezoelectric layer 23', it is not connected with other electrodes or an electrode connecting part, and thus does not have any role as a subsidiary connecting part.

To connect the fifth electrode 45' to the vibrating member 20a' and to connect the sixth electrode 46' to the second electrode 42', the electrode connecting part 60' is formed on outer circumferential surfaces of the first and second piezoelectric layers 22' and 23', as shown in FIG. 5.

The electrode connecting part 60' is made up of first and second conductors 63' and 61'.

The first conductor 63' electrically connects the fifth electrode 45' and the vibrating member 20a' to each other. For this, the first conductor 63' is extended to a lower part of an outer circumferential surface of the vibrating member 20a' from a portion of the fifth electrode 45' extended onto the outer circumferential surface of the second piezoelectric layer 23', via the subsidiary connecting part 47 formed on the outer circumference of the first piezoelectric layer 23'. At this time, because the first electrode 41' and the vibrating member 20a' are already electrically connected with or to each other by the conductive or the non-conductive adhesive, the fifth electrode 45' is connected to the fifth electrode 41' through the first conductor 63' and the vibrating member 20a'.

The second conductor 61' electrically connects the sixth and the second electrodes 46' and 42' to each other. For this, the second conductor 61' is extended to an outer edge portion of the second electrode 42' from a portion of the sixth electrode 46' extended onto the outer circumferential surface of the second piezoelectric layer 23'. At this time, because the second electrode 42' and the third electrode 43' are already electrically connected with or to each other by the conductive or the non-conductive adhesive, the sixth electrode 46' is connected to the second and third electrodes 42' and 43' through the second conductor 61' of the electrode connecting part 60'.

Here, in the above description, although the second conductor 61' is explained and illustrated as being formed to electrically connect the six and the second electrodes 46' and 42' with or to each other, the present invention is not limited thereto. That is, because the portion of the sixth electrode 46' located on the upper surface of the second piezoelectric layer 23' is already attached with the second electrode 42' by the conductive or the non-conductive adhesive, the second conductor 61' may be omitted.

The first and second conductors 63' and 61' may be formed of a conductive paste, such as a silver paste, which can be easily formed on the first and second piezoelectric layers 22' and 23' and/or the vibrating member 20a'.

The modified vibrating element 20' as described above is configured, so that the first and second piezoelectric layers 22' and 23' have the same electrode pattern. Thus, there is no need to separately and differently fabricate the first and second piezoelectric layers 22' and 23', and the first and second piezoelectric layers 22' and 23' can be used to be exchangeable or compatible to each other. Accordingly, the modified vibrating element 20' is more easy to fabricate and reduces a fabrication cost, as compared with the vibrating element 20 explained with reference to FIGS. 1 through 4D.

Hereinafter, an operation of the lens barrel having the ultrasonic motor 1 to which the vibrating element 20 in accordance with the exemplary embodiment of the present invention is applied will be explained with reference to FIGS. 1 through 4D.

First, as the fourth and the fifth electrodes 44 and 45 of the first and second piezoelectric layer 22 and 23 of the piezoelectric body 21 are respectively applied with alternating voltages of sine and cosine forms, which coincide in frequency, through the flexible printed circuit board 68, the second piezoelectric layer 23 having the fourth electrode 44 thereon and the first piezoelectric layer 22 having the first electrode 41 connected with the fifth electrode 45 through the first conductor 63 generate sine waves in the circumferential direction, respectively. At this time, because the first and second piezoelectric layer 22 and 23 are disposed to have the spatial phase difference of $\lambda/4$, the two sine waves generated from the first and second piezoelectric layers 22 and 23, respectively, are combined into one even traveling wave. As a result, the piezoelectric body 21 generates minute displacements or deformations in the form of the traveling wave (i.e., a ripple). Accordingly, the vibrating element 20 having the piezoelectric body 21 attached thereto vibrates while generating displacements or deformations in the form of the traveling wave.

As the vibrating element 20 vibrates, the plurality of projections 28 formed on the vibrating element 20 also vibrates, and thus the abrasion resistance-coating layer 29 on the plurality of projections 28 rotates the contacting element 30 while coming in friction contact with the friction material layer 35 of the contacting element 30. As the contacting element 30 rotates, the rotary ring 15 connected with the rotating member 31 of the contacting element 30 rotated about an optic axis of the movable cylinder 10. At this time, because the rotary ring 15 is engaged with the movable cylinder 10 to be rotatable and a key member 14 fixed on the fixed cylinder 12 is engages in a key groove 16 of the movable cylinder 10 to be movable left and right, the movable cylinder 10 is moved left or right along the optic axis thereof by the rotation of the rotary ring 15. As a result, lenses L fixed in the movable cylinder 10 are focused.

Although exemplary embodiments of the present invention has been shown and described, it will be appreciated by those skilled in the art that changes may be made in the exemplary embodiments without departing from the principles and spirit of the invention, the scope of which is defined in the claims and their equivalents.

What is claimed is:

1. A vibrating element of an ultrasonic motor, the vibrating element comprising:
   a vibrating member; and
   a piezoelectric body which is attached to the vibrating member and produces a traveling wave to vibrate the vibrating member when electric power is applied to the piezoelectric body,
   wherein the piezoelectric body comprises:
   a first piezoelectric layer having a first surface, a second surface opposite to the first surface, and an outer circumferential surface, the first piezoelectric layer being attached to the vibrating member,
   a second piezoelectric layer having a first surface, a second surface opposite to the first surface, and an outer circumferential surface, the second piezoelectric layer being attached to the first piezoelectric layer,
   an electrode part comprising a plurality of electrodes formed on the first surfaces and the second surfaces of the first and second piezoelectric layers, and
   an electrode connecting part formed on the outer circumferential surfaces of the first and second piezoelectric layers to selectively connect the plurality of electrodes to one other.

2. The vibrating element as claimed in claim 1, wherein the vibrating member is formed of a material having an electric conductivity.

3. The vibrating element as claimed in claim 1, wherein the first and second piezoelectric layers are attached to each other by one of a conductive adhesive and a non-conductive adhesive.

4. The vibrating element as claimed in claim 3, wherein the conductive adhesive comprises a conductive epoxy resin and the non-conductive adhesive comprises a non-conductive epoxy resin.

5. The vibrating element as claimed in claim 1, wherein:
   each of the first and second piezoelectric layers include positive poles and negative poles alternately arranged,
   the polarized positive and negative poles of the first and second piezoelectric layers have a spatial phase difference of $\lambda/4$, and
   $\lambda$ is a length of one wavelength in a circumferential direction of the traveling wave.

6. The vibrating element as claimed in claim 1, wherein the electrode part comprises: a first electrode formed on the first surface of the first piezoelectric layer, a second electrode formed on the second surface of the first piezoelectric layer, a third electrode formed on the first surface of the second piezoelectric layer, a fourth electrode formed on the second surface of the second piezoelectric layer, a fifth electrode formed separately from the fourth electrode on the second surface of the second piezoelectric layer, and a sixth electrode formed separately from the fourth and fifth electrodes on the second surface of the second piezoelectric layer, and
   wherein each of the fifth and sixth electrodes is selectively connected with at least one of the first electrode, the second electrode, the third electrode and the vibrating member by the electrode connecting part.

7. The vibrating element as claimed in claim 6, wherein one of an alternating voltage of sine form and an alternating voltage of cosine form is applied to the fourth electrode,
   wherein the other one of the alternating voltage of sine form and the alternating voltage of cosine form is applied to the fifth electrode, and
   wherein the sixth electrode is grounded.

8. The vibrating element as claimed in claim 6, wherein the electrode connecting part comprises:
   a first conductor which electrically connects the fifth electrode and the first electrode to each other; and
   a second conductor which electrically connects the sixth electrode and the third electrode to each other.

9. The vibrating element as claimed in claim 8, wherein the first conductor is extended from the fifth electrode along the outer circumferential surface of the second piezoelectric layer to the outer circumferential surface of the first piezoelectric layer and is connected with a contact of the first electrode extended onto the outer circumferential surface of the first piezoelectric layer.

10. The vibrating element as claimed in claim 9, wherein the first conductor is further extended to the vibrating member.

11. The vibrating element as claimed in claim 8, wherein the second conductor is extended from the sixth electrode to the outer circumferential surface of the second piezoelectric layer and is connected with a contact of the third electrode extended onto the outer circumferential surface of the second piezoelectric layer.

12. The vibrating element as claimed in claim 11, wherein the second conductor is further extended to a contact of the second electrode extended to an outer edge of the second surface of the first piezoelectric layer.

13. The vibrating element as claimed in claim 8, wherein each of the first and second conductors comprise a conductive paste.

14. The vibrating element as claimed in claim 6, wherein a pattern of the electrodes formed on the first piezoelectric layer is the same as a pattern of the electrodes formed on the second piezoelectric layer and is disposed to have a spatial phase difference of $\lambda/4$ relative to the pattern of the electrodes formed on the second piezoelectric layer, and
wherein $\lambda$ is a length of one wavelength in a circumferential direction of the traveling wave.

15. The vibrating element as claimed in claim 6, wherein the electrode connecting part comprises a first conductor which electrically connects the fifth electrode and the vibrating member to each other.

16. The vibrating element as claimed in claim 15, wherein the first piezoelectric layer has an electrode pattern in which a first dummy electrode, a subsidiary connecting part, and a second dummy electrode are disposed in an interval of $\lambda/4$ in a circumferential direction relative to one another, the first dummy electrode being extended from the second surface to the first surface via the outer circumferential surface and separated from the first and second electrodes, the subsidiary connecting part being formed on the outer circumferential surface and separated from the first and second electrodes, and the second dummy electrode being extended from the second surface to the outer circumferential surface and separated from the first and second electrodes, and
wherein the second piezoelectric layer has an electrode pattern in which the sixth electrode, a dummy subsidiary connecting part and the fifth electrode are formed to have the same pattern as the pattern of the first dummy electrode, the subsidiary connecting part, and the second dummy electrode of the first piezoelectric layer and disposed to have a phase difference of the interval of $\lambda/4$ relative to the first dummy electrode, the subsidiary connecting part, and the second dummy electrode of the first piezoelectric layer, and
wherein $\lambda$ is a length of one wavelength in a circumferential direction of the traveling wave.

17. The vibrating element as claimed in claim 16, wherein a portion of the fifth electrode extends onto the outer circumference of the second piezoelectric layer and the first conductor extends from the portion of the fifth electrode extended onto the outer circumference to an outer circumferential surface of the vibrating member, via the subsidiary connecting part formed on the outer circumference of the first piezoelectric layer.

18. The vibrating element as claimed in claim 15, wherein the first conductor comprises a conductive paste.

19. The vibrating element as claimed in claim 16, wherein the electrode connecting part further comprises a second conductor to electrically connect the sixth electrode and the second electrode to each other.

20. The vibrating element as claimed in claim 19, wherein the second conductor is extended to an outer edge portion of the second electrode from a portion of the sixth electrode extended onto the outer circumferential surface of the second piezoelectric layer.

21. The vibrating element as claimed in claim 19, wherein the second conductor comprises a conductive paste.

22. An ultrasonic motor comprising:
a vibrating element comprising a vibrating member, and a piezoelectric body which is attached to the vibrating member and produces a traveling wave when electric power is applied to the piezoelectric body; and
a contacting element to come in friction contact with the vibrating element when the vibrating element is deformed by the traveling wave,
wherein the piezoelectric body comprises:
a first piezoelectric layer having a first surface, a second surface opposite to the first surface, and an outer circumferential surface, the first piezoelectric layer being attached to the vibrating member,
a second piezoelectric layer having a first surface, a second surface opposite to the first surface, and an outer circumferential surface, the second piezoelectric layer being attached to the first piezoelectric layer,
an electrode part comprising a plurality of electrodes formed on the first surfaces and the second surfaces of the first and second piezoelectric layers, and
an electrode connecting part formed on the outer circumferential surfaces of the first and second piezoelectric layers to selectively connect the plurality of electrodes to one other.

23. The ultrasonic motor as claimed in claim 22, wherein the electrode part comprises: a first electrode formed on the first surface of the first piezoelectric layer, a second electrode formed on the second surface of the first piezoelectric layer, a third electrode formed on the first surface of the second piezoelectric layer, a fourth electrode formed on the second surface of the second piezoelectric layer, a fifth electrode formed separately from the fourth electrode on the second surface of the second piezoelectric layer; and a sixth electrode formed separately from the fourth and fifth electrodes on the second surface of the second piezoelectric layer; and
wherein each of the fifth and sixth electrodes is selectively connected with at least one of the first electrode, the second electrode, the third electrode and the vibrating member by the electrode connecting part.

24. The ultrasonic motor as claimed in claim 23, wherein the electrode connecting part comprises:
a first conductor which electrically connects the fifth electrode and the first electrode to each other; and
a second conductor which electrically connects the sixth electrode and the third electrode to each other.

25. The ultrasonic motor as claimed in claim 23, wherein a pattern of the electrodes formed on the first piezoelectric layer is the same as a pattern of the electrodes formed on the second piezoelectric layer and is disposed to have a spatial phase difference of $\lambda/4$ relative to the pattern of the electrodes formed on the second piezoelectric layer, and
wherein $\lambda$ is a length of one wavelength in a circumferential direction of the traveling wave.

26. The ultrasonic motor as claimed in claim 23, wherein the electrode connecting part comprises a first conductor which electrically connects the fifth electrode and the vibrating member to each other.

27. The ultrasonic motor as claimed in claim 26, wherein the first piezoelectric layer has an electrode pattern in which a first dummy electrode, a subsidiary connecting part, and a second dummy electrode are disposed in an interval of $\lambda/4$ in a circumferential direction relative to one another, the first dummy electrode being extended from the second surface to the first surface via the outer circumferential surface and separated from the first and second electrodes, the subsidiary connecting part being formed on the outer circumferential surface and separated from the first and second electrodes, and the second dummy electrode being extended from the second surface to the outer circumferential surface and separated from the first and second electrodes, and wherein the second piezoelectric layer has an electrode pattern in which the sixth electrode, a dummy subsidiary connecting part and the fifth electrode are formed to have the same pattern as the pattern of the first dummy electrode, the subsidiary connecting part, and the second dummy electrode of the first piezoelectric layer and disposed to have a phase difference of the interval of $\lambda/4$ relative to the first dummy electrode, the subsidiary connecting part, and the second dummy electrode of the first piezoelectric layer, and wherein $\lambda$ is a length of one wavelength in a circumferential direction of the traveling wave.

28. The ultrasonic motor as claimed in claim 27, wherein a portion of the fifth electrode extends onto the outer circumferential surface of the second piezoelectric layer and the first conductor extends from the portion of the fifth electrode extended onto the outer circumferential surface to an outer circumferential surface of the vibrating member, via the subsidiary connecting part formed on the outer circumference of the first piezoelectric layer.

29. The ultrasonic motor as claimed in claim 27, wherein the electrode connecting part further comprises a second conductor to electrically connect the sixth electrode and the second electrode to each other.

30. The ultrasonic motor as claimed in claim 29, wherein the second conductor is extended to an outer edge portion of the second electrode from a portion of the sixth electrode extended onto the outer circumferential surface of the second piezoelectric layer.

* * * * *